US012622123B2

(12) United States Patent
Hugon et al.

(10) Patent No.: US 12,622,123 B2
(45) Date of Patent: May 5, 2026

(54) METHOD FOR MANUFACTURING AN OPTOELECTRONIC DEVICE

(71) Applicant: ALEDIA, Echirolles (FR)

(72) Inventors: Xavier Hugon, Teche (FR); Eric Pourquier, Grenoble (FR); Frédéric Mayer, Voiron (FR); Thomas Lacave, Grenoble (FR); Philippe Gibert, St Etienne de Crossey (FR); Mickaël Rebaud, Grenoble (FR); Emmanuel Petitprez, Grenoble (FR)

(73) Assignee: ALEDIA, Echirolles (FR)

( * ) Notice: Subject to any disclaimer, the term of this patent is extended or adjusted under 35 U.S.C. 154(b) by 554 days.

(21) Appl. No.: 18/043,257

(22) PCT Filed: Aug. 10, 2021

(86) PCT No.: PCT/EP2021/072310
§ 371 (c)(1),
(2) Date: Feb. 27, 2023

(87) PCT Pub. No.: WO2022/043053
PCT Pub. Date: Mar. 3, 2022

(65) Prior Publication Data
US 2023/0307486 A1     Sep. 28, 2023

(30) Foreign Application Priority Data
Aug. 31, 2020    (FR) ...................................... 2008838

(51) Int. Cl.
*H10H 29/14*          (2025.01)
(52) U.S. Cl.
CPC ................................. *H10H 29/142* (2025.01)

(58) Field of Classification Search
CPC ................................................... H01H 29/142
See application file for complete search history.

(56) References Cited

U.S. PATENT DOCUMENTS

| 2012/0205614 A1 | 8/2012 | Templier et al. |
| 2016/0172535 A1 | 6/2016 | Choi et al. |

(Continued)

FOREIGN PATENT DOCUMENTS

| EP | 2491591 B1 | 8/2012 |
| EP | 2936571 B1 | 2/2017 |
| WO | 2011020959 A1 | 2/2011 |

OTHER PUBLICATIONS

Michalik et al., "Experiments on MEMS integration in 0.25 μm CMOS process", Sensors, 2018, vol. 18, No. 7, p. 2111.

(Continued)

*Primary Examiner* — Samuel A Gebremariam
(74) *Attorney, Agent, or Firm* — HAUPTMAN HAM, LLP

(57) ABSTRACT

A method for manufacturing an optoelectronic device includes providing a support supporting a plurality of three-dimensional semiconductor structures, forming a sacrificial portion under a first set of 3D structures of the plurality of three-dimensional semiconductor structures, forming a barrier portion around the sacrificial portion, said barrier portion having a basal wall extending under the sacrificial portion, and a lateral wall extending at the edge of the sacrificial portion, forming an access trench up to the sacrificial portion, the access trench extending continuously along the lateral wall of the barrier portion, etching the sacrificial portion from the access trench, and removing the first set of 3D structures.

17 Claims, 13 Drawing Sheets

(56) References Cited

U.S. PATENT DOCUMENTS

| | | |
|---|---|---|
| 2017/0092719 A1 | 3/2017 | Mandl et al. |
| 2019/0198485 A1 | 6/2019 | Chae et al. |

OTHER PUBLICATIONS

International Search Report and Written Opinion ssued in corresponding International Application No. PCT/EP2021/072310, mailed Nov. 11, 2021, pp. 1-9, European Patent Office, Rijswijk, Netherlands.

C1

C1

C1          144a          144b

C2

51,40

4

51   12   30   50        134

C1

21          23          22

40   50

124

C1

C1

144a 144b

4

2b

60

METHOD FOR MANUFACTURING AN OPTOELECTRONIC DEVICE

TECHNICAL FIELD OF THE INVENTION

The invention relates to the field of semiconductor technologies. It is particularly advantageously applicable in the manufacture of optoelectronic devices comprising three-dimensional structures, for example light-emitting diodes based on semiconductor wires or nanowires.

PRIOR ART

The so-called 3D architectures of microelectronic and optoelectronic devices based on arrays of three-dimensional semiconductor structures, such as nanowires or microwires, are considered as promising alternatives to conventional architectures based on two-dimensional semiconductor structures, such as flat layers.

Such devices with 3D architecture may have an improved overall efficiency. Ordered arrays of nanowires based on a semiconductor material such as GaN, or more generally based on a direct gap material for optoelectronics, often have a crystalline quality higher than that of a flat layer based on the same material. This makes it possible for example to improve the emission of light from an optoelectronic device such as a light-emitting diode with 3D architecture (3D LED). The optical properties of such arrays also make it possible to improve the extraction of the light.

The manufacture of functional optoelectronic devices with 3D architecture requires structuring the ordered arrays of 3D structures, particularly to define contact areas of the device. These ordered arrays of 3D structures may also be connected to a driving electronics. Generally, the driving electronics of a 3D LED is attached to a rear face of the nanowire array or arrays. It is then necessary to create an access area or an opening through the nanowire array to clear a contact area of the driving electronics, usually called "pad" or "CMOS pad" for a driving electronics based on CMOS transistors (Complementary Metal-Oxide-Semiconductor).

A plurality of known solutions make it possible to form an area devoid of 3D structures.

Thus, one solution consists of locally growing the array of 3D structures at emission areas of the 3D LED, by masking the areas where the 3D structures are undesirable, typically the contact areas intended to contact the driving electronics of the device. Such a solution often results in an inhomogeneity and/or discontinuities in the array of 3D structures, generally due to disturbances of the growth at the edges of the masked areas. This affects the performances of 3D optoelectronic devices.

Another solution disclosed in the document EP 2936571 A1 consists of growing the 3D structures homogeneously on the entire surface of the wafer, then removing them from the areas where these are undesirable. The removal of 3D structures may be carried out by localised etching or via a mechanical action for example. This generally induces roughness problems that are detrimental in the method for manufacturing 3D LED. The reproducibility of the method is degraded.

The present invention aims to overcome at least partially the abovementioned drawbacks.

In particular, one object of the present invention is to propose a method for manufacturing a 3D optoelectronic device having an improved reproducibility.

Another object of the invention is to propose a method for manufacturing a 3D optoelectronic device making it possible to clear a contact area intended to contact a driving electronics of the device.

The other aims, features and advantages of the present invention will appear upon examination of the following description and accompanying drawings. It is understood that other advantages may be incorporated.

SUMMARY OF THE INVENTION

To achieve the abovementioned objectives, a first aspect of the invention relates to a method for manufacturing an optoelectronic device comprising at least one first area devoid of three-dimensional (3D) semiconductor structures and at least one second area provided with three-dimensional (3D) semiconductor structures. This method comprises the following steps:

Providing a support supporting on a basal plane a plurality of three-dimensional semiconductor structures, said structures each having a base turned towards a first side, also called rear face, and an apex opposite the base, turned towards a second side, also called front face, opposite the first side, Forming, from the first side, a sacrificial portion under the bases of a first set of 3D structures of the plurality of three-dimensional semiconductor structures, Forming a barrier portion around the sacrificial portion, said barrier portion having a basal wall extending under the sacrificial portion, and a lateral wall extending at the edge of the sacrificial portion, said lateral wall separating, in projection in a direction normal to the basal plane, the first set of 3D structures of a second set of 3D structures of the plurality of three-dimensional semiconductor structures, Forming, from the second side, an access trench up to the sacrificial portion, said access trench extending continuously along the lateral wall of the barrier portion, in projection in the direction normal to the basal plane, Etching the sacrificial portion from the access trench, Removing the first set of 3D structures, such as to define the at least one first area of the device.

Thus, forming the access trench and etching the sacrificial portion under the first set of 3D structures make it possible to separate the first set from the device without it being necessary to etch the 3D structures. This eliminates the roughness problems related to the etching of 3D structures implemented in the known solutions. The removal of the 3D structures of the first set is further facilitated. The sacrificial portion is typically buried at the base of the 3D structures to be removed. The access trench typically makes it possible to cut out the set of 3D structures to be removed, and access the sacrificial portion.

The barrier portion further makes it possible to confine the etching to the sacrificial portion. This makes it possible to avoid impairing the support supporting the 3D structures of the second set. This barrier portion comprises a basal wall and a lateral wall. It may have a dome shape. Its extension in the basal plane and along the normal to the basal plane makes it possible to stop the etching along two directions, in depth and laterally. Its shape is advantageously concave seen from the second side. The lateral wall is preferably substantially normal to the basal wall. This barrier portion is preferably continuous, the lateral wall and the basal wall being connected. Advantageously, these walls are not perforated.

The basal wall makes it possible to stop the etching in the direction normal to the basal plane. It forms a protection for underlying elements, for example a driving electronics.

The lateral wall makes it possible to stop the etching in the direction parallel to the basal plane. It forms a protection for adjacent elements, for example contact patterns of the 3D structures of the second set.

The at least one first area devoid of 3D structures thus created may advantageously make it possible to access a contact pad of a driving electronics of the device, in a localised way and without impairing the surrounding elements of the device.

In a preferable but non-limiting manner, the method further comprises, before forming the access trench, forming a contact area, also called contact pad, under the bases of the first set of 3D structures, and under the sacrificial portion. Such a contact pad is typically intended to contact a driving electronics of the device.

According to one example, the sacrificial portion is based on a metal material and the barrier portion is based on a dielectric material. The sacrificial portion may be formed from a first metal layer corresponding to a first level M1 of the device. The barrier portion may be formed from a dielectric layer coating the sacrificial portion. The contact pad may be formed from a second metal layer corresponding to a second layer M2 of the device. The contact pad here is under the barrier portion, typically under the basal wall. This makes it possible to protect the contact pad during the removal of the first set of 3D structures.

According to an alternative example, the sacrificial portion is based on a dielectric material and the barrier portion is based on a metal material. The sacrificial portion may be formed from the dielectric layer. The barrier portion may be formed from the second metal layer corresponding to the second level M2 of the device. Selective etching of the dielectric material in relation to the metal material makes it possible to expose the basal wall of the barrier portion made of a metal material. The contact pad may consequently be directly formed by the basal wall of barrier portion.

The number of method steps making it possible to form a contact pad is thus reduced.

BRIEF DESCRIPTION OF THE FIGURES

The aims, subject matter, as well as the features and advantages of the invention will become clear from the detailed description of embodiments of said latter which are illustrated by the following accompanying drawings wherein.

DETAILED DESCRIPTION

Figure 1:
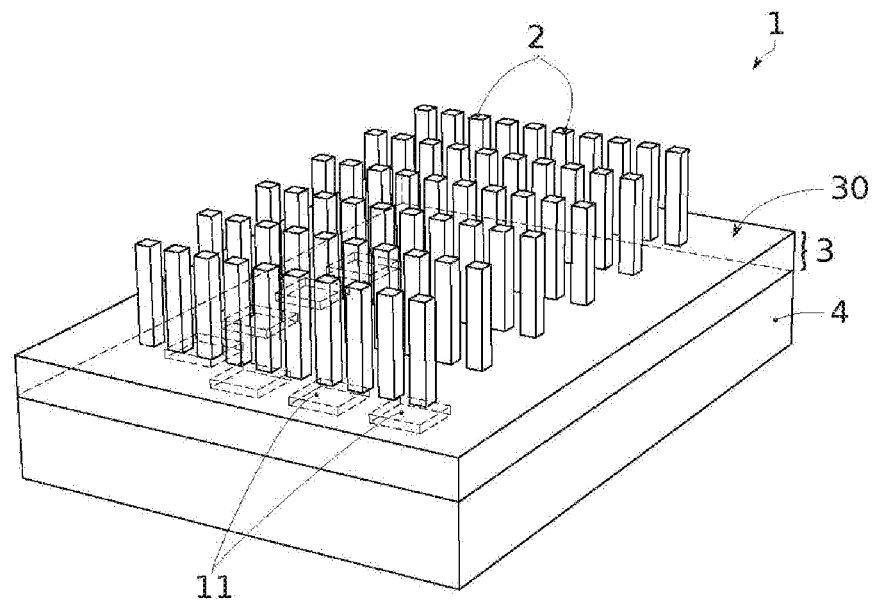
FIG. 1 illustrates an array of 3D structures sitting on top of the contact pads buried according to an issue of the present invention.

Before initiating a detailed review of embodiments of the invention, it is reminded that the invention particularly comprises the optional features hereafter that may be used in combination or alternately.

According to one example, the etching of the sacrificial portion has an etching selectivity $S_{30:50}$ of the material of the sacrificial portion in relation to the material of the barrier portion greater than or equal to 5:1. Such a selective etching makes it possible to preserve the barrier portion at the end of etching the sacrificial portion.

According to one example, the formation of the access trench is carried out by anisotropic etching mainly directed in the direction z normal to the basal plane xy. This makes it possible to laterally cut out the first set of structures.

According to one example, the etching of the sacrificial portion is an isotropic etching. This makes it possible to separate the first set of structures in relation to the underlying barrier portion.

According to one example, the access trench is formed between the structures of the first set and the lateral wall of the barrier portion, in projection in the direction z normal to the basal plane xy. This makes it possible to avoid etching structures of the first set. The formation of the access trench is facilitated.

According to one example, the method further comprises, before forming the access trench, forming a contact area under the bases of the first set of 3D structures, said contact area being intended to contact a driving electronics of the device. According to one example, the method further comprises, before forming the access trench, assembling a driving electronics of the device at the contact area. This makes it possible to assemble the driving electronics, typically a CMOS based electronics, before removing the first set of 3D structures. A standard copper-copper assembly method may thus advantageously be used. This makes it possible to simplify the method for manufacturing the system comprising the optoelectronic device and its driving electronics. This makes it possible to reduce the costs of manufacturing such a system.

According to one example, the driving electronics is based on thin-film transistors TFT. According to one example, the transistors TFT are formed according to a so-called IGZO (Indium Gallium Zinc Oxide) technology.

According to one example, the sacrificial portion is made of a metal material and the barrier portion is made of a dielectric material.

According to one example, the method comprises:

Depositing from the first side a first metal layer corresponding to a first level, then Etching said first metal layer from the first side, configured to define the sacrificial portion in the first metal layer, Depositing from the first side a dielectric layer, configured to encapsulate the sacrificial portion and form the barrier portion.

According to one example, the method comprises:

Before assembling the driving electronics, depositing from the first side a second metal layer corresponding to a second level, on the dielectric layer, then Etching said second metal layer from the first side, configured to define the contact area in the second metal layer, and After assembling the driving electronics and removing the first set of 3D structures, etching the dielectric barrier portion, from the second side, configured to expose a face of the contact area thus defined, facing the second side.

According to one example, the sacrificial portion is made of a dielectric material and the barrier portion is made of a metal material.

According to one example, the method comprises:

Depositing from the first side a dielectric layer, in such a way that a portion of said dielectric layer located under the first set of 3D structures forms the sacrificial portion, Etching the dielectric layer at the edge of the first set of 3D structures, in projection in a direction z normal to the basal plane xy, followed by a metal deposition, configured to form the lateral wall of the barrier portion, Depositing from the first side a second metal layer corresponding to a second level, on the portion of the dielectric layer forming the sacrificial portion and flush with the lateral wall, Etching said second metal layer from the first side, configured to define the basal portion of the barrier portion in the second metal layer and in contact with the lateral wall.

According to one example, the contact area is formed directly by the basal wall of the barrier portion.

According to one example, the portion of the dielectric layer forming the sacrificial portion is structured before depositing the second metal layer, so as to form alignment marks protruding from the basal wall of the barrier portion. These alignment marks make it possible for example to facilitate a subsequent formation of a colour converter module. More generally the alignment marks make it possible to carry out technological operations in the front face by accurately aligning on the markers of the structures assembled in the rear face, typically the markers of a CMOS plate.

According to one example, the method further comprises forming a colour converter module at the structures of the second set.

According to one example, the formation of the colour converter module is carried out before removing the first set of 3D structures.

According to one example, the formation of the colour converter module is carried out after removing the first set of 3D structures.

According to one example, the contact area is protected by a protective layer during the formation of the colour converter module.

According to one example, the manufacturing method comprises producing a contact area, or pad, of an optoelectronic device comprising a plurality of three-dimensional (3D) semiconductor structures. The 3D structures typically each have a base turned towards a rear face and an apex opposite the base, turned towards a front face. The pad is intended to contact a driving electronics of the device. It typically extends along a basal plane underlying the bases of the 3D structures.

Advantageously, the method comprises:

Providing a plurality of three-dimensional semiconductor structures,

Depositing a first metal layer on a first level M1 in the rear face, facing the bases, Forming a sacrificial portion under the bases of a first set of 3D structures, Forming contact patterns from the first metal layer under the bases of a second set of 3D structures, Depositing a second metal layer on a second level M2 separate from the first level M1, Forming a barrier portion around the sacrificial portion, said barrier portion having a closed contour under and at the edge of the sacrificial portion, such as to form a dome receiving the sacrificial portion under the first set of 3D structures, Etching the sacrificial portion, from the front face of the device, Removing the first set of 3D structures, such as to define an access area towards the second metal layer, Exposing a region of the second metal layer from the access area, said region forming the pad.

Except in the case of incompatibility, technical features described in detail for a given embodiment may be combined with technical features described in the context of other embodiments described by way of non-limiting example, in such a way as to form another embodiment that is not necessarily illustrated or described. Such an embodiment obviously is not excluded from the invention. For example, the alignment marks formed in the metal M2 and illustrated in FIGS. 2G, 2H for the first embodiment of the invention may also be envisaged as a variant in the second embodiment of the invention illustrated in FIGS. 3D, 3E.

In the present invention, the manufacturing method is in particular dedicated to the manufacture of LED having a 3D architecture (3D LED).

The invention may be implemented more widely for various optoelectronic or microelectronic devices with 3D architecture.

Therefore, the invention may also be implemented within the scope of laser or photovoltaic devices, or also within the scope of devices comprising transistors or memories.

Unless explicitly mentioned, it is specified that, within the scope of the present invention, the relative arrangement of a third layer inserted between a first layer and a second layer, does not necessarily mean that the layers are directly in contact with one another, but means that the third layer is either directly in contact with the first and second layers, or separated from them by at least one other layer or at least one other element.

The steps of the method such as claimed are understood in the broad sense and are not necessarily successive, unless indicated. They may optionally be performed simultaneously, or also in a plurality of substeps.

In the present patent application, the first side typically corresponds to a rear face of the device, and the second side typically corresponds to a front face of the device. The rear face thus designates rather the side (C1 in the drawings) from which the method steps are carried out. Likewise, the front face thus designates rather the side (C2 in the drawings) from which the method steps are carried out.

In the present patent application, the terms "light-emitting diode", "LED" or simply "diode" are used as synonyms. A "LED" may also mean a "micro-LED".

A substrate, a layer, a device, "based on" a material M, means a substrate, a layer, a device comprising this material M only or this material M and optionally other materials, for example alloy elements, impurities or doping elements. Thus, a layer based on gallium nitride (GaN) may for example comprise gallium nitride (GaN or GaN-i) or doped gallium nitride (GaN-p, GaN-n). An active region based on indium gallium nitride (InGaN) may for example comprise aluminium gallium nitride (AlGaN) or gallium nitride with various aluminium and indium contents (GaInAlN).

"Selective etching in relation to" or "etching having a selectivity in relation to" means an etching configured to remove a material A or a layer A in relation to a material B or to a layer B, and having an etching speed of the material A greater than the etching speed of the material B. The selectivity is the ratio between the etching speed of the material A to the etching speed of the material B. The selectivity between A and B is noted $S_{A:B}$.

A coordinate system, preferably orthonormal, comprising the axes x, y, z is shown in certain appended figures. The plan basal extends in a plane xy of this coordinate system.

In the present patent application, preferably reference will be made to thickness for a layer and to height for a structure or a device. The thickness is taken in a direction normal to the main extension plane of the layer, and the height is taken perpendicular to the basal plane xy of the substrate. Thus, a metal layer typically has a thickness along z, and a LED has a height along z. The relative terms "under", "underlying" refer to positions taken in the direction z.

The dimensional values mean within the measurement and manufacturing tolerances.

The terms "substantially", "approximately", "in the order of" mean, when they relate to a value, "to within 10%" of this value or, when they relate to an angular orientation, "to within 10°" of this orientation. Thus, a direction substantially normal to a plane means a direction having an angle of 90±10° in relation to the plane.

In order to determine whether a contact pad of a device based on 3D structures has been manufactured or cleared according to the method described in this invention, an analysis by scanning electron microscopy (SEM) or by transmission electron microscopy (TEM) may be carried out.

In particular, an observation in transverse section on the contact pad may determine whether this pad has a bowl geometry, or whether the flanks overlying the pad bear the imprint of a bowl.

Another characteristic result of implementing the method according to the invention is obtaining a pad having a preserved surface at the edge of a homogeneous and preserved set of 3D structures.

The combination of these geometric and physical features may be a serious indication of the use of the method as described in the present invention.

FIG. 1 illustrates an issue that the method according to the invention makes it possible to resolve. To obtain a device 1 based on evenly distributed and homogeneous 3D structures 2, it is preferable to grow the 3D structures 2 over the entire surface 300 of the substrate 3. Consequently, it is generally necessary to produce openings in the array of 3D structures 2, in such a way as to make it possible to access areas buried under the 3D structures 2, for example contact areas 40 of the device 1. Certain 3D structures must thus be removed without damaging the other surrounding structures, in particular the adjacent 3D structures and the underlying contact areas.

In the following examples, the 3D structures are semi-conductor nanowires 2. It is understood that the method is perfectly suitable for the removal of other types of 3D structures, for example and in a non-limiting manner: pyramids, fins. To remove these 3D structures, one principle of the invention is to form a sacrificial portion under the 3D structures to be removed and a barrier portion under and at the edge of the sacrificial portion. An etching of the sacrificial portion via an access trench consequently makes it possible to separate the 3D structures to be removed. The barrier portion makes it possible to avoid damaging the surrounding structures during the etching of the sacrificial portion. In the following, a first embodiment provides a sacrificial portion made of a dielectric material, for example made of silicon or silicon nitride, and a barrier portion made of a metal material, for example made of aluminium. A second embodiment provides on the contrary a sacrificial portion made of a metal material and a barrier portion made of a dielectric material.

In the following examples, the device is an optoelectronic device, preferably a light-emitting diode (LED). It is understood that the method is perfectly suitable for the manufacture of other devices, for example lasers or photovoltaic cells, or also microelectronic devices or microelectromechanical systems (MEMS).

Figure 2A:
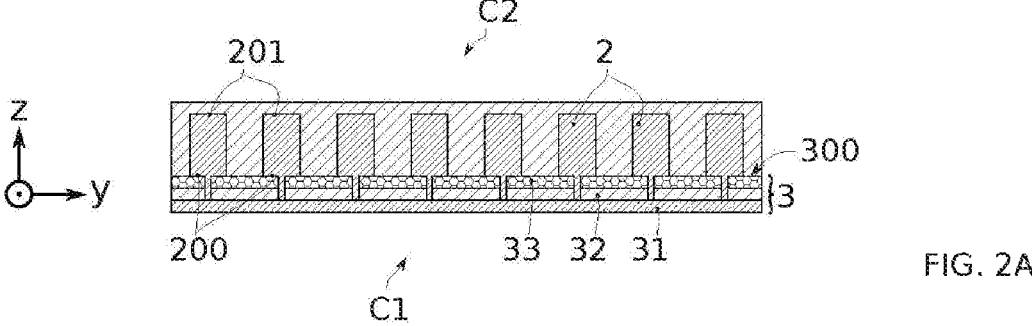
FIGS. 2A to 2F illustrate in section steps of a method for producing an optoelectronic device according to a first embodiment of the present invention.

As illustrated in FIG. 2A, a first step of the method consists of providing 3D structures, here semiconductor nanowires 2, on a supporting substrate 3. These nanowires 2 are preferably based on III-V materials, for example based on GaN, AlGaN, InGaN. Alternatively, they may be based on II-VI materials, for example based on ZnO, ZnSe, or also based on IV-IV materials, for example based on Si, SiGe.

The nanowires 2 preferably extend longitudinally along z. They may have a height between a few tens of nanometres and a plurality of micrometres, for example between 100 nm and 20 μm. They may have various shapes, in section in the plane xy. The nanowires 2 based on GaN typically have a substantially hexagonal section. The maximum dimension of the nanowires 2 in the plane xy, for example the diameter, may be between a few tens of nanometres and a plurality of micrometres, for example between 50 nm and 5 μm. They have an apex 201 and a base 200. Their base 200 rests on the substrate 3. Preferably, they are substantially parallel with one another and evenly distributed on the substrate 3. They may be encapsulated by an encapsulation layer 24, for example made of a dielectric material such as silicon dioxide or silicon nitride. This makes it possible to protect the nanowires 2. This also makes it possible to improve the mechanical strength of the array of nanowires 2 on the substrate 3.

The substrate 3 typically has a surface 300 supporting the base 200 of the nanowires 2. This surface 300 mainly extends in a basal plane xy. It may be flat or slightly structured. In a known manner, the substrate 3 may comprise a solid support layer (not illustrated), a nucleation layer 31, one or more masking layers 32, 33. According to this example, the nanowires 2 are typically obtained by growing from the nucleation layer 31, through openings of the masking layer 32 and/or of the anti-reflection layer 33.

The solid support layer underlying the layers 31, 32, 33 may be removed partially or totally. In a known manner, a manipulation substrate (not illustrated) is assembled on the side C2, in the "front face", of the device 1. The solid support layer is then removed mechanically, by trimming, and/or chemically, by etching, and/or by means of a laser. This makes it possible to expose the nucleation layer 31 or the side C1, in the "rear face", of the device 1. The nucleation layer 31 may optionally also be removed.

Figure 2B:
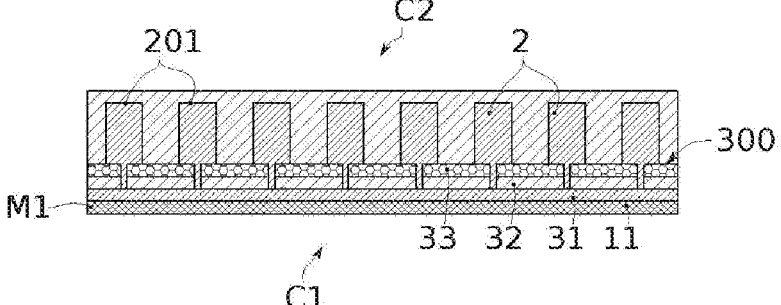

According to a first embodiment, a first metal layer 11, for example made of aluminium, is deposited in the rear face on the nucleation layer 31, as illustrated in FIG. 2B. This first metal layer 11 corresponds to a first metal level M1.

Figure 2C:
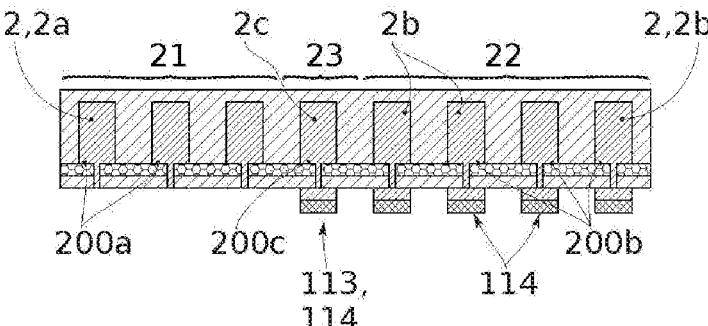

As illustrated in FIG. 2C, the first metal layer 11 and/or the nucleation layer 31 are structured, typically by anisotropic etching from the rear face, so as to totally remove the portions of the layers 11, 31 located under the bases 200*a* of a first set 21 of nanowires 2*a*. This first metal level M1 typically makes it possible to form individual contact pins 114 under the bases 200*b* of a second set 22 of nanowires 2*b*. According to a preferred possibility, the anisotropic etching is configured to form a continuous metal line 113 under the bases 200*c* of a third set 23 of nanowires 2*c* at the immediate edge of the first set 21. This metal line 113 makes it possible to separate, in projection in the plane xy, the first set 21 of the second set 22. Alternatively, a discontinuous line 113 or pins 114 may be formed under the bases 200*c* of the nanowires 2*c*.

The nanowires 2*a* of the first set 21 are intended to be removed at the end of the method. The nanowires 2*b* of the second set 22 are typically active nanowires intended to emit light. The nanowires 2*c* of the third set 23 are typically inactive nanowires, generally called "dummy".

Figure 2D:
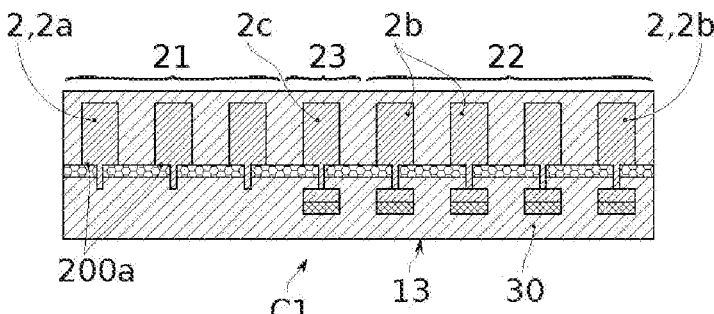

As illustrated in FIG. 2D, a dielectric layer 13, for example made of SiO2, is subsequently deposited in the rear face in such a way as to form a sacrificial portion 30 under the first set 21 of nanowires 2*a*. This layer 13 preferably coats the contact pins 114 and/or the line 113. This makes it possible to ensure the mechanical strength of the pins 114 and/or of the line 113 whilst electrically insulating them from one another.

Figure 2E:
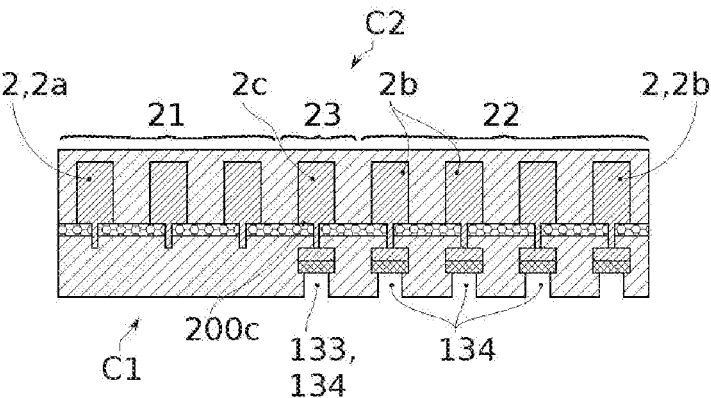

As illustrated in FIG. 2E, an etching of the dielectric layer 13, typically by anisotropic etching from the rear face, is carried out so as to form vias 134 under the individual contact pins 114. According to a preferred possibility, this etching is configured to form a continuous trench 133 under the metal line 113. Alternatively, a discontinuous trench 133 or vias 134 may be formed under the contact pins 114 and/or the line 113 located under the bases 200*c* of the nanowires 2*c*.

Figure 2F:
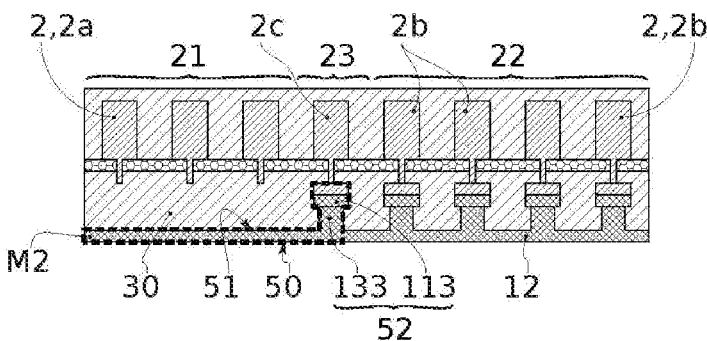

As illustrated in FIG. 2F, the trench 133 and/or the vias 134 are subsequently filled with metal. This filling may be carried out directly during the deposition in the rear face of a second metal layer 12, for example made of aluminium, on the dielectric layer 13. Alternatively, the filling and the deposition of the second metal layer may be carried out independently. The second metal layer is flush with the trench 133 and/or vias 134 filled with metal. This second metal layer 12 extends in a plane xy and is structured so as to form a second metal level M2. This metal level M2 is typically intended to connect the nanowires 2*b* forming subpixels of the same colour. Thus, it is understood that this metal level M2 comprises various tracks connecting various subpixels or nanowires 2*b*, although this aspect is not visible in the figures in transverse section along yz. The second metal layer 12 is continuous under the sacrificial portion 30. A metal barrier portion 50 is thus formed under and at the edge of the dielectric sacrificial portion 30.

The function of the barrier portion 50 is to protect surrounding regions during the subsequent etching of the sacrificial portion 30. It typically makes it possible to limit an expansion of this etching outside of the sacrificial portion 30. Such an etching is thus confined to the sacrificial portion 30.

In this example, the trench 133, or the vias 134 filled with metal and located under the bases 200*c* of the nanowires 2*c*, form, in combination with the line 113 or with the contact pins 114 located under the bases 200*c* of the nanowires 2*c*, a lateral wall 52 of the metal barrier portion 50. This lateral wall 52 limits or avoids a lateral expansion of the etching, i.e. mainly in directions of the plane xy, at the edge of the sacrificial portion. This lateral wall 52 is preferably continuous. This stops the lateral expansion of the etching more efficiently, in particular in the case of a wet etching. Alternatively, it may be perforated or serrated. The lateral wall may have a thickness, taken in the plane xy, between 50 nm and 2 µm. According to one possibility, the lateral wall 52 is not located vertically aligned with the nanowires 2*c*. It may be located between the nanowires 2*b* and the nanowires 2*a*, in projection on a plane xy.

One portion of the second metal layer 12 extending under the first and third sets 21, 23 of nanowires 2*a*, 2*c* forms a basal wall 51 of the metal barrier portion 50. This basal wall 51 stops an expansion of the etching in the direction z, under the sacrificial portion. The basal wall may have a thickness, taken along z, between 50 nm and 2 µm.

Figure 2G:
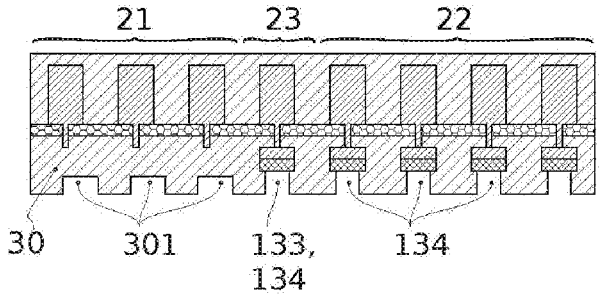
FIGS. 2G and 2H illustrate variants of the steps respectively illustrated in FIGS. 2E and 2F.
Figure 2H:
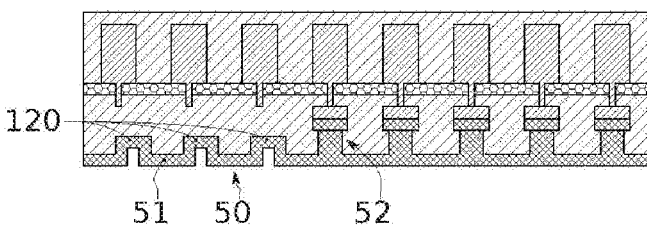

According to a variant illustrated in FIGS. 2G, 2H, patterns 301 are formed in the sacrificial portion 30, from the rear face, then filled at least partially during the deposition of the second metal layer 12. Alignment marks 120 are thus formed protruding from the basal wall 51 (FIG. 2H). These alignment marks 120 typically make it possible to facilitate the alignment of various lithographic masks during subsequent steps, for example during the formation of a colour converter module as described in the following.

Figure 2I:
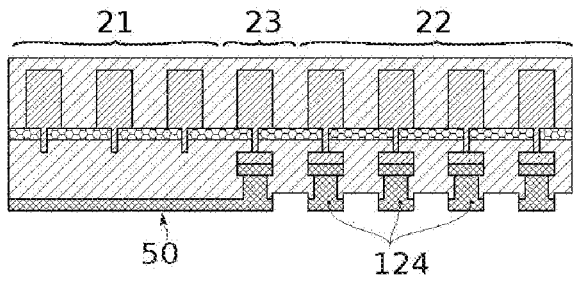
FIGS. 2I to 2P illustrate steps of a method for producing an optoelectronic device according to the first embodiment of the present invention.

The second metal layer 12 may then be etched so as to form contact pins 124 or tracks under the vias 134 and/or the contact pins 114. This makes it possible to collectively or individually contact the active nanowires 2*b* of the second set 22. This etching is preferably configured to separate the barrier portion 50 of the contact pins 124 (FIG. 2I).

Figure 2J:
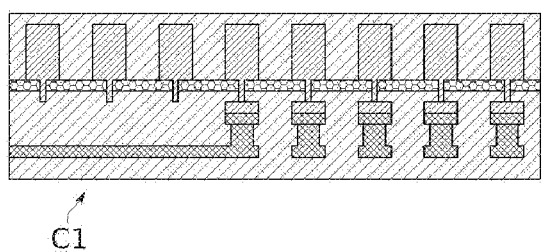
Figure 2K:
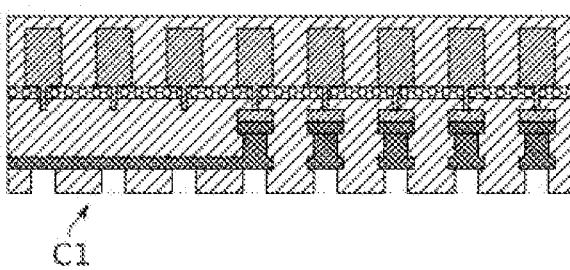
Figure 2L:
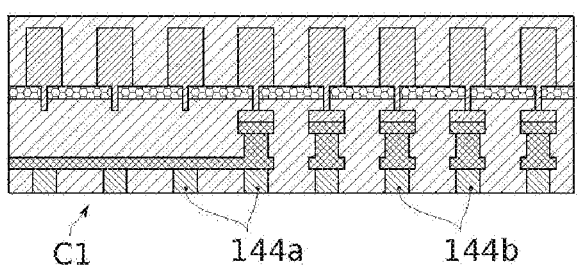
Figure 2M:
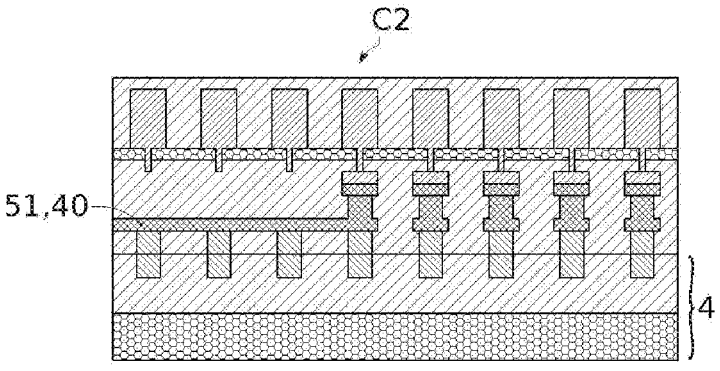

As illustrated in FIGS. 2J, 2K, 2L, the rear face C1 may be shaped and/or prepared so as to receive bonding pads 144*a*, 144*b*. These bonding pads 144*a*, 144*b* are typically made of copper. They make it possible to connect, in a known manner, a driving electronics 4 as illustrated in FIG. 2M. In particular, the bonding pads 144*a* are configured to contact the metal barrier portion 50, typically at the basal wall 51. The bonding pads 144*b* may be configured to contact the active nanowires 2*b*, via contact pins 124 for example.

It is understood that other levels of metals and of vias or of pins may be formed between the level M2 and the bonding pads 144*a*, 144*b*.

A driving electronics 4 of the device based on nanowires is preferably assembled in the rear face, via bonding pads 144*a*, 144*b*. This driving electronics 4 may typically be a CMOS (Complementary Metal-Oxide-Semiconductor) based driving electronics. Alternatively, it may be based on thin-film transistors TFT. According to one example, the transistors TFT are formed according to an IGZO technology. The basal wall 51 of the barrier portion 50 consequently advantageously forms a contact pad 40 for the driving electronics 4. This contact pad 40 is at this stage buried under the nanowires 2*a*. In the following, certain steps of the method aim to clear this contact pad 40 so as to make it accessible from the front face C2.

Figure 2N:
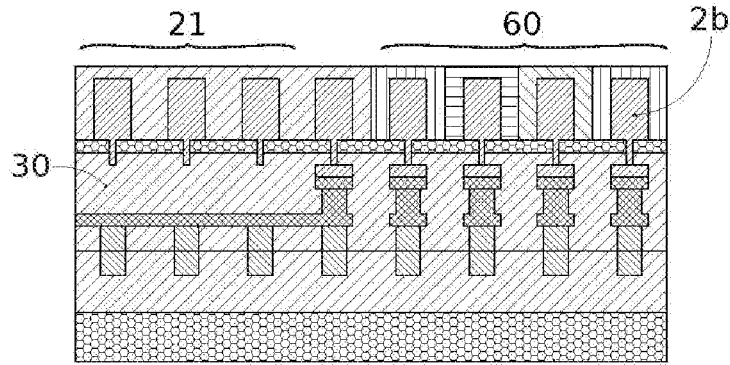

According to one possibility illustrated in FIG. 2N, a colour converter module 60 is formed at the nanowires 2*b* of the second set 22. In a known manner, such a module 60 is configured to convert light emitted by the nanowires 2*b* having a first wavelength, into light having one or more different wavelengths, typically of first, second and third wavelengths corresponding to the colours blue (B), green (G) and red (R). This makes it possible to form BGR subpixels of a pixel of a display screen for example, from the active nanowires 2*b*. Such a module 60 is typically formed by localised deposition of various nanoparticles on various subsets of nanowires 2*b* intended to form subpixels. The localised deposition may be facilitated by the presence of alignment marks in the device, as illustrated in FIG. 2H for example. Alternatively, the module 60 may be formed according to other colour conversion techniques. It may for example comprise coloured filters.

Figure 2O:
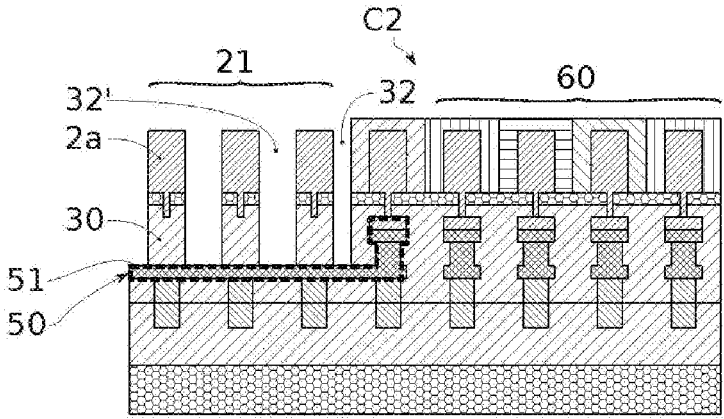
Figure 2P:
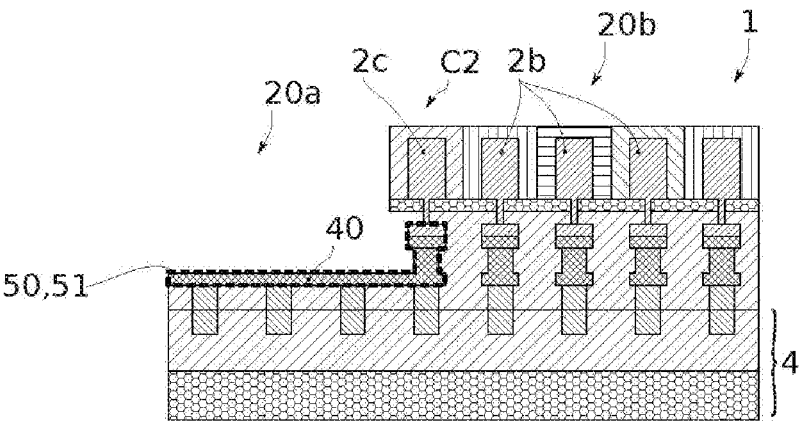
Figure 2Q:
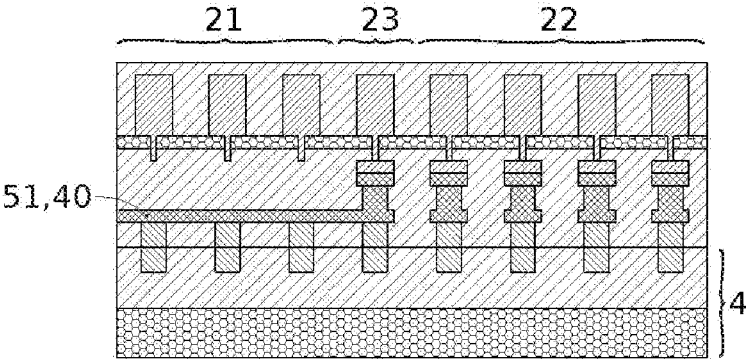
FIGS. 2Q to 2V illustrate variants of the steps respectively illustrated in FIGS. 2M to 2P.

FIGS. 2O and 2P illustrate the removal of the nanowires 2*a* from the first set 21. An access trench 32 is firstly formed in the rim of the first set 21. This access trench 32 has a continuous contour in projection in the plane xy. This makes it possible to cut out the first set 21, and to separate it from the second set 22. The access trench 32 is configured to lead to the sacrificial portion 30. It may optionally extend up to the basal wall 51 of the barrier portion 50, as illustrated in FIG. 2O. Such an access trench 32 is typically formed by anisotropic etching along z from the front face C2. Preferably, it has an etching selectivity $S_{30:50}$ of the dielectric material of the sacrificial portion 30 in relation to the metal material of the barrier portion 50 such as $S_{30:50}>5:1$. This makes it possible to stop the etching of the access trench 32 on the barrier portion 50 whilst preserving the surface condition of this barrier portion 50. This is particularly advantageous when the barrier portion 50 is intended to form directly the contact pad 40. The access to the sacrificial portion 30 is carried out through the access trench 32. Other vias or trenches 32' may be formed in such a way as to improve or facilitate the access to the sacrificial portion 30. These vias or trenches 32' may be produced in the same way as the access trench 32, by the same anisotropic etching. These additional vias or trenches 32' are preferably formed between the nanowires 2*a* to be removed. Thus, it is not necessary to etch the nanowires 2*a*.

The sacrificial portion 30 is subsequently etched by isotropic etching so as to remove the nanowires 2*a* (FIG. 2P). The isotropic etching makes it possible to separate the nanowires 2*a* from the substrate. The nanowires 2*a* are subsequently removed easily. This advantageously limits or eliminates recourse to a mechanical action to eliminate the nanowires 2*a*. The isotropic etching here is configured to etch the dielectric material of the sacrificial portion 30 selectively with the metal material of the barrier portion 50, preferably with a selectivity $S_{30:50}>5:1$. This makes it possible to remove the entire sacrificial portion whilst maintaining the barrier portion 50, as illustrated in FIG. 2P. The basal wall 51 of the barrier portion 50 is consequently exposed on the side of the front face C2. It advantageously forms a contact pad 40 for the driving electronics 4. An optoelectronic device 1 coupled to a driving electronics 4, comprising an area 20*a* devoid of nanowires 2*a* and leading directly to a contact pad 40 of the driving electronics 4, and an area 20*b* provided with active nanowires 2*b*, is produced. In this example, the colour converter module 60 is produced at the area 20*b* before removing the nanowires 2*a* from the area 20*a*.

Figure 2R:
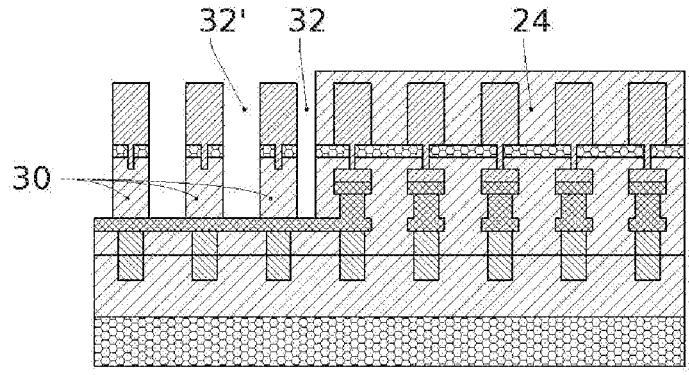
Figure 2S:
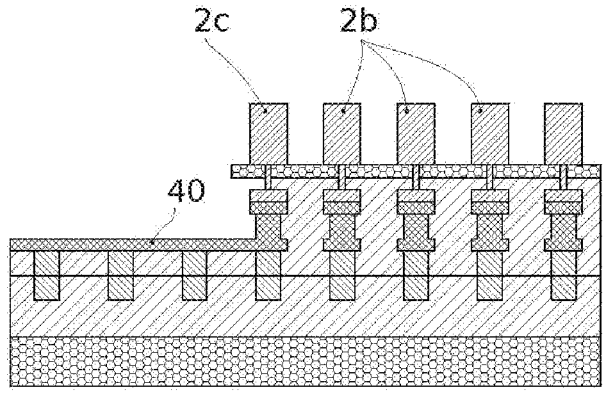
Figure 2T:
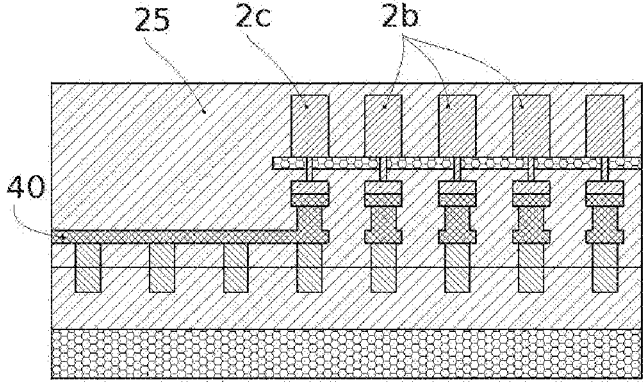
Figure 2U:
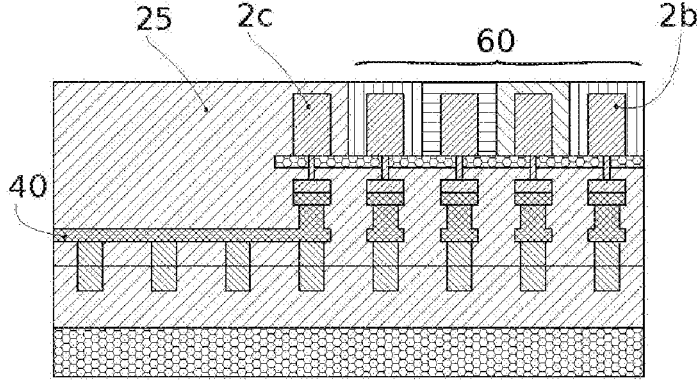
Figure 2V:
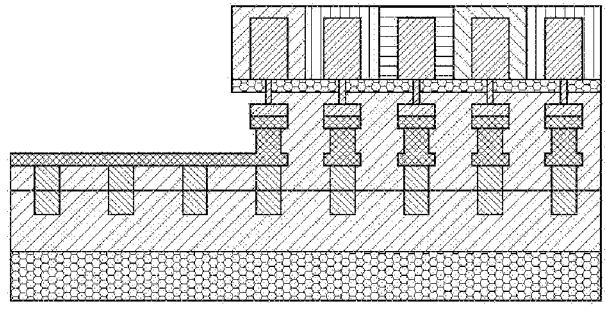

According to one variant illustrated in FIGS. 2Q to 2V, this colour converter module 60 may be produced after removing the nanowires 2*a* from the area 20*a*. In particular, after assembling the driving electronics 4 (FIG. 2Q), the access trench or trenches 32, 32' are formed (FIG. 2R). The sacrificial portion 30 and the encapsulation layer 24 may subsequently be eliminated via the isotropic etching of the dielectric material (FIG. 2S), before forming the colour converter module 60. According to one possibility, the encapsulation layer 24 is maintained in view of the formation of the colour converter module 60. This avoids an additional planarisation step. A protective layer 25 is preferably deposited on the contact pad 40 and the nanowires 2*b*, 2*c* (FIG. 2T). The colour converter module 60 is subsequently formed at the nanowires 2*b* (FIG. 2U). The protective layer 25 may subsequently be removed locally in such a way as to clear the contact pad 40 (FIG. 2V). The marking of the contact pad 40, and optionally of the alignment marks 120 related to the contact pad, is facilitated by removal of the nanowires 2*a* prior to the formation of the colour converter module 60. This makes it possible to improve the alignment precision of the various lithographic masks implemented during the formation of the colour converter module.

Figure 3A:
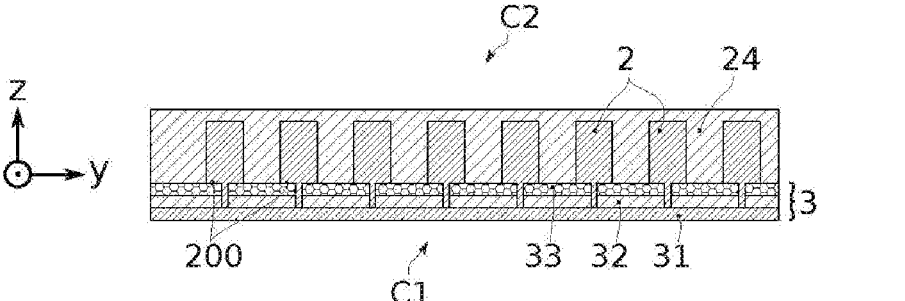
FIGS. 3A to 3N illustrate steps of a method for producing an optoelectronic device according to a second embodiment of the present invention.
Figure 3B:
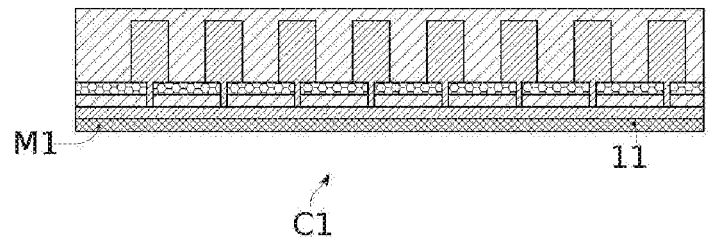
FIGS. 3O to 3R illustrate variants of the steps respectively illustrated in FIGS. 3J to 3N. The drawings are given by way of examples and are not restrictive of the invention. They constitute schematic representations intended to facilitate the understanding of the invention and are not necessarily to the scale of the practical applications. In particular, the dimensions of the various elements of the optoelectronic device are not necessarily representative of the reality.
Figure 3C:
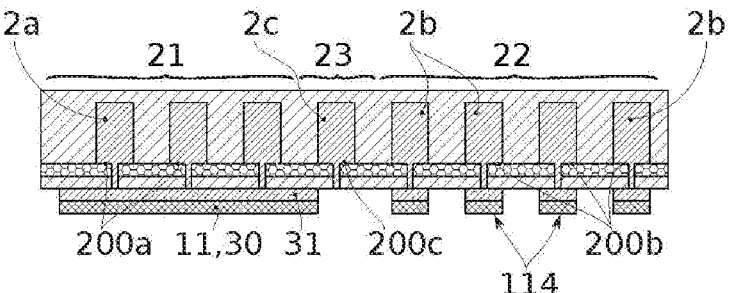
Figure 3D:
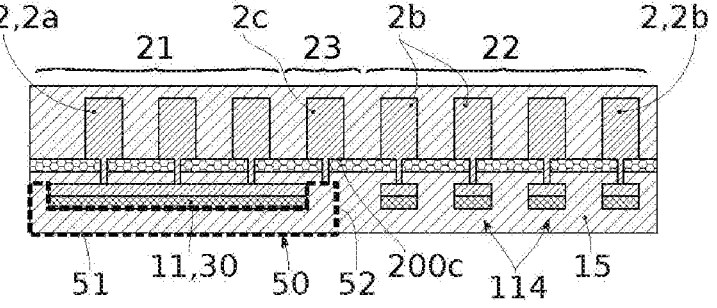
Figure 3E:
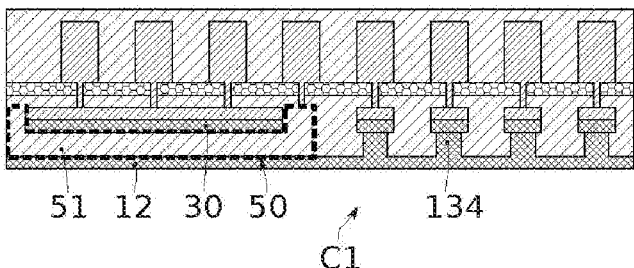
Figure 3F:
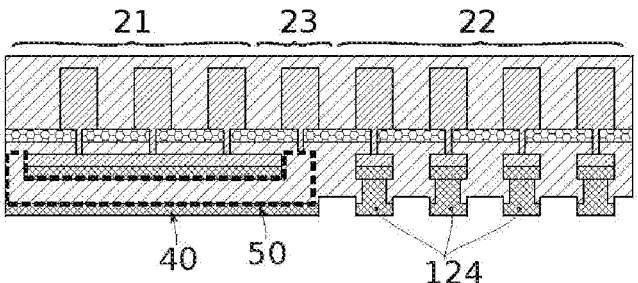
Figure 3G:
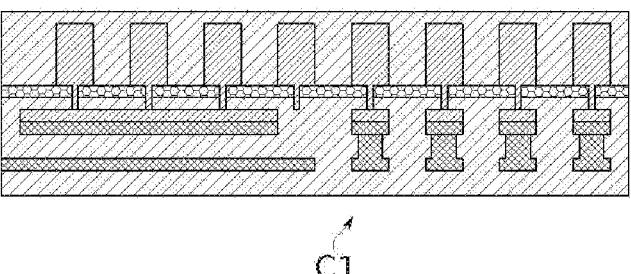
Figure 3H:
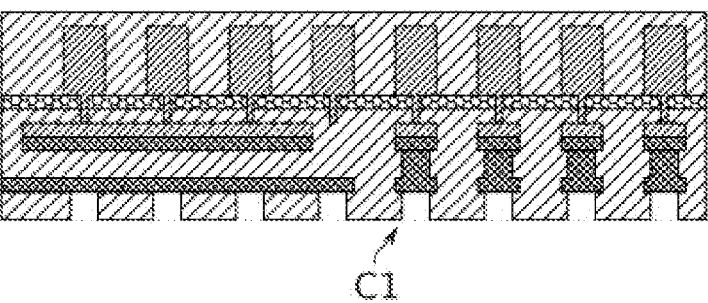
Figure 3I:
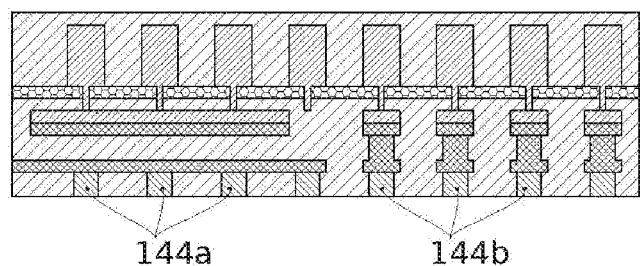
Figure 3J:
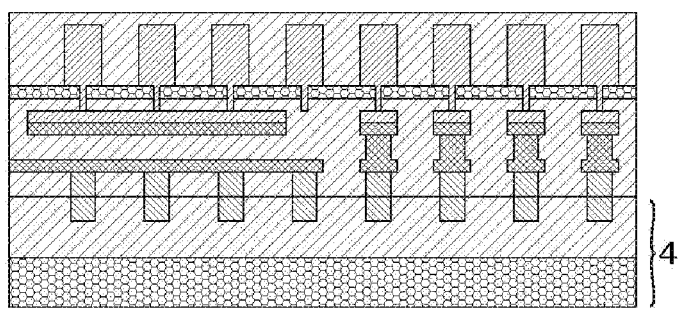
Figure 3K:
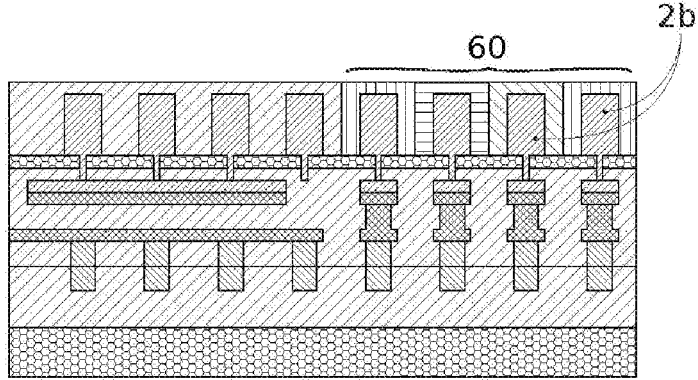
Figure 3L:
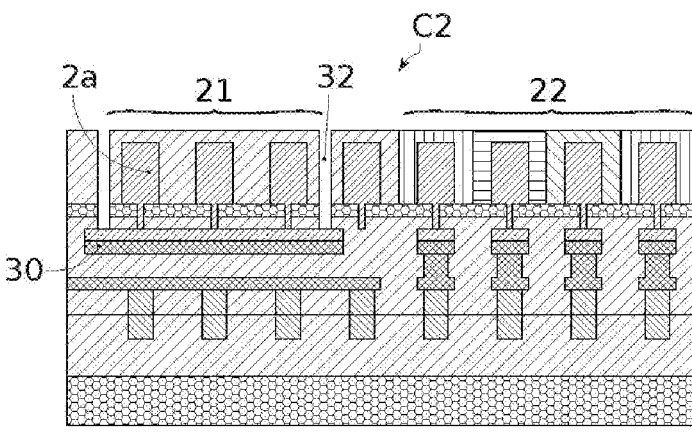
Figure 3M:
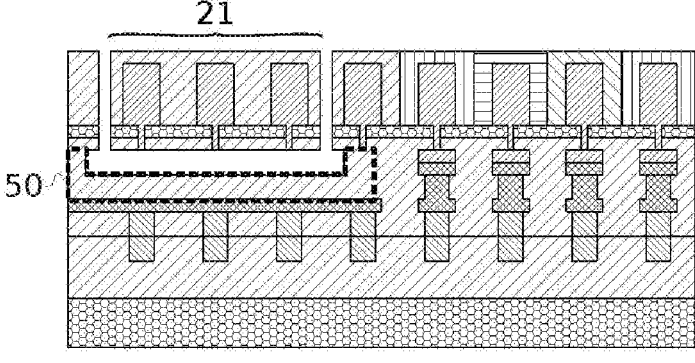
Figure 3N:
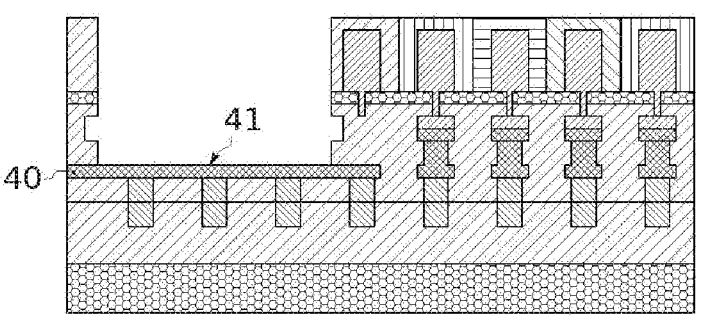
Figure 3O:
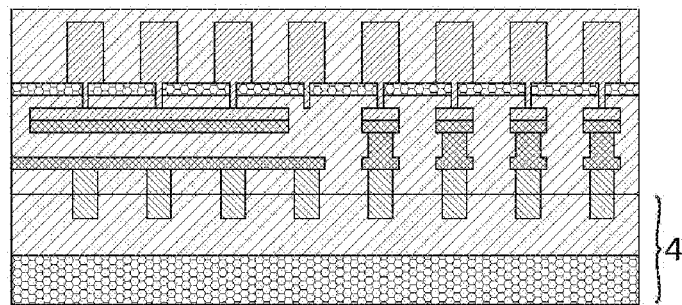
Figure 3P:
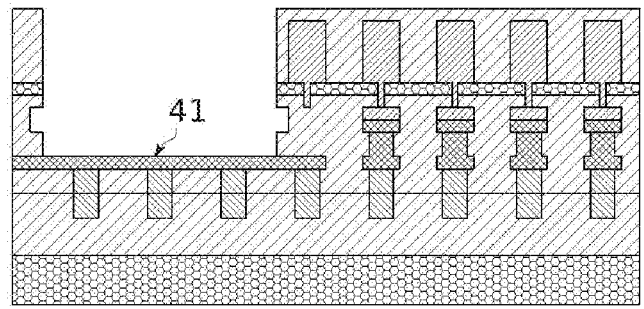
Figure 3Q:
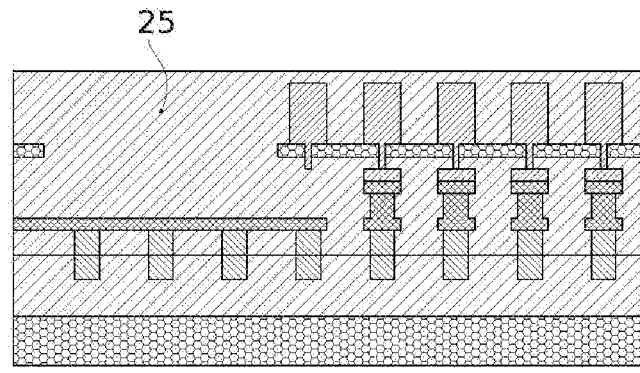
Figure 3R:
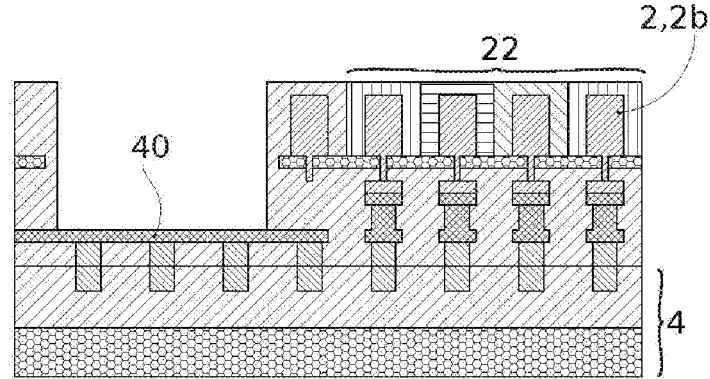

A second embodiment according to the invention is illustrated by FIGS. 3A to 3R. Only the distinct features of the first embodiment are described hereafter, the other features not described being esteemed identical to those of the first embodiment.

After providing the substrate 3 supporting the semiconductor nanowires 2 (FIG. 3A), a first metal layer 11, for example made of aluminium, is deposited in the rear face C1 of the substrate 3, as illustrated in FIG. 3B. This first metal layer 11 corresponds to the first metal level M1.

As illustrated in FIG. 3C, the first metal layer 11 and/or the nucleation layer 31 are structured, typically by anisotropic etching from the rear face C1, so as to form a metal sacrificial portion 30 under the bases 200*a* of the first set 21 of nanowires 2*a*. This first metal level M1 also makes it possible to form individual contact pins 114 under the bases 200*b* of a second set 22 of nanowires 2*b*.

As illustrated in FIG. 3D, a dielectric layer 15, for example made of SiO2, is subsequently deposited in the rear face in such a way as to form a dielectric barrier portion 50 under and at the edge of the metal sacrificial portion 30. This layer 15 preferably coats the contact pins 114. In this example, a portion of the dielectric layer 15 located under the bases 200*c* of the nanowires 2*c* forms a lateral wall 52 of the dielectric barrier portion 50. The lateral wall may have a thickness, taken in the plane xy, between 100 nm and 2 μm.

Another portion of the dielectric layer 15 extending under the first and third sets 21, 23 of nanowires 2*a*, 2*c* forms a basal wall 51 of the dielectric barrier portion 50. The basal wall may have a thickness, taken along z, between 50 nm and 2 μm.

Vias 134 filled with metal are subsequently formed under the individual contact pins 114, as above. A second metal layer 12, for example made of aluminium, is subsequently deposited on the basal wall 51 of the dielectric barrier portion 50 (FIG. 3E).

The second metal layer 12 may subsequently be etched so as to form a contact pad 40 under the barrier portion 50. According to one possibility, other structures, alternately or in combination with the pad 40, may be formed by this etching under the barrier portion 50. This etching makes it possible for example to form alignment marks under the barrier portion 50. This etching is preferably configured to form contact pins 124 under the vias 134 and/or the contact pins 114 (FIG. 3F).

As illustrated in FIGS. 3G, 3H, 3I, the rear face C1 may be shaped and/or prepared so as to receive bonding pads 144*a*, 144*b*, as above. The bonding pads 144*a* are typically configured to contact the contact pad 40. The bonding pads 144*b* may be configured to contact the active nanowires 2*b*, via contact pins 124 for example.

A driving electronics 4 of the device based on nanowires is preferably assembled in the rear face, via bonding pads 144*a*, 144*b* (FIG. 3J).

According to one possibility illustrated in FIG. 3K, a colour converter module 60 is formed at the nanowires 2b of the second set 22, as above.

FIGS. 3L and 3M illustrate the removal of the nanowires 2a from the first set 21. An access trench 32 is firstly formed in the rim of the first set 21. This access trench 32 has a continuous contour in projection in the plane xy. This makes it possible to cut out the first set 21, and to separate it from the second set 22. The access trench 32 is configured to lead to the sacrificial portion 30, as illustrated in FIG. 3L. Such an access trench 32 is typically formed by anisotropic etching along z from the front face C2. It preferably has an etching selectivity $S_{30:50}$ of the metal material of the sacrificial portion 30 in relation to the dielectric material of the barrier portion 50 such as $S_{30:50}>5:1$. The access to the sacrificial portion 30 is carried out through the access trench 32. Other vias or trenches may be formed in such a way as to improve or facilitate the access to the sacrificial portion 30 (not illustrated).

The sacrificial portion 30 is subsequently etched by isotropic etching so as to separate the nanowires 2a from the device 1 (FIG. 3M). The isotropic etching here is configured to etch the metal material of the sacrificial portion 30 selectively with the dielectric material of the barrier portion 50, preferably with a selectivity $S_{30:50}>5:1$.

At the end of the removal of the first set 21 of nanowires 2a, the dielectric barrier portion 50 covers and protects the contact pad 40. An etching of the dielectric barrier portion 50 may be carried out in such a way as to expose a face 41 of the contact pad 40, in the front face C2, as illustrated in FIG. 3N.

In this example, the colour converter module 60 is produced before removing the nanowires 2a.

According to one variant illustrated in FIGS. 3O to 3R, this colour converter module 60 may be produced after removing the nanowires 2a. In particular, after assembling the driving electronics 4 (FIG. 3O), the sacrificial portion 30 with optionally the barrier portion 50 may be etched (FIG. 3P), before forming the colour converter module 60. Consequently, a protective layer 25 is preferably deposited on the contact pad 40 (FIG. 3Q). The colour converter module 60 is subsequently formed at the nanowires 2b, and the protective layer 25 may subsequently be removed in such a way as to clear the contact pad 40, as above (FIG. 3R).

The invention is not limited to the above-described embodiments and extends to all of the embodiments covered by the claims.

The invention claimed is:

1. A method of manufacturing an optoelectronic device comprising at least one first area devoid of three-dimensional semiconductor structures and at least one second area provided with three-dimensional 3D semiconductor structures, said method comprising:

providing a support that supports a plurality of three-dimensional semiconductor structures on a basal plane xy, said structures each having a base turned towards a first side and an apex opposite the base, turned away from the first side and turned towards a second side opposite the first side, the first side being the real face of the device, and the second side being the front face of the device, forming, from the first side, a sacrificial portion under the bases of a first set of 3D structures of the plurality of three-dimensional semiconductor structures, forming a barrier portion around the sacrificial portion, said barrier portion having a basal wall extending under the sacrificial portion, and a lateral wall extending at the edge of the sacrificial portion, said lateral wall separating, in projection in a direction z normal to the basal plane xy, the first set of 3D structures from a second set of 3D structures of the plurality of three-dimensional semiconductor structures, forming, from the second side, an access trench up to the sacrificial portion, said access trench extending continuously along the lateral wall of the barrier portion, in projection in the direction z normal to the basal plane, etching the sacrificial portion from the access trench, and removing the first set of 3D structures, so as to define the at least one first area of the device.

2. The method according to claim 1, wherein etching the sacrificial portion has an etching selectivity $S_{30:50}$ of the material of the sacrificial portion in relation to the material of the barrier portion greater than or equal to 5:1.

3. The method according to claim 1, wherein the formation of the access trench is carried out by anisotropic etching mainly directed in the direction z normal to the basal plane xy and wherein the etching of the sacrificial portion is an isotropic etching.

4. The method according to claim 1, wherein the access trench is formed between the structures of the first set and the lateral wall of the barrier portion, in projection in the direction z normal to the basal plane xy.

5. The method according to claim 1, further comprising, before forming the access trench, forming a contact area under the bases of the first set of 3D structures, said contact area being intended to contact a driving electronics of the device.

6. The method according to claim 5, further comprising, before forming the access trench, assembling a driving electronics of the device at the contact area.

7. The method according to claim 1, wherein the sacrificial portion is made of a metal material and the barrier portion is made of a dielectric material.

8. The method according to claim 7, comprising:

depositing from the first side a first metal layer corresponding to a first level, then etching said first metal layer from the first side, configured to define the sacrificial portion in the first metal layer, and depositing from the first side a dielectric layer, configured to encapsulate the sacrificial portion and form the barrier portion.

9. The method according to claim 6, further comprising:

depositing from the first side a first metal layer corresponding to a first level, then etching said first metal layer from the first side, configured to define the sacrificial portion in the first metal layer, depositing from the first side a dielectric layer, configured to encapsulate the sacrificial portion and form the barrier portion, before assembling the driving electronics, depositing from the first side a second metal layer corresponding to a second level, on the dielectric layer, then etching said second metal layer from the first side, configured to define the contact area in the second metal layer, and after assembling the driving electronics and removing the first set of 3D structures, etching the dielectric barrier portion, from the second side, configured to expose a face of the contact area thus defined, facing the second side and wherein the sacrificial portion is made of a metal material and the barrier portion is made of a dielectric material.

10. The method according to claim 1, wherein the sacrificial portion is made of a dielectric material and the barrier portion is made of a metal material.

11. The method according to claim 10, comprising:

depositing from the first side a dielectric layer, in such a way that a portion of said dielectric layer located under the first set of 3D structures forms the sacrificial portion, etching the dielectric layer at the edge of the first set of 3D structures, in projection in a direction z normal to the basal plane xy, followed by a metal deposition, configured to form the lateral wall of the barrier portion, depositing from the first side a second metal layer corresponding to a second level, on the portion of the dielectric layer forming the sacrificial portion and flush with the lateral wall, etching said second metal layer from the first side, configured to define the basal portion of the barrier portion in the second metal layer and in contact with the lateral wall.

12. The method according to claim 11, wherein the contact area is formed directly by the basal wall of the barrier portion and further comprising:

before forming the access trench, forming a contact area under the bases of the first set of 3D structures, said contact area being intended to contact a driving electronics of the device.

13. The method according to claim 11, wherein the portion of the dielectric layer forming the sacrificial portion is structured before depositing the second metal layer, so as to form alignment marks protruding from the basal wall of the barrier portion, said alignment marks making it possible for example to facilitate a subsequent formation of a colour converter module.

14. The method according to claim 1, further comprising forming a colour converter module at the structures of the second set.

15. The method according to claim 14, wherein the formation of the colour converter module is carried out before removing the first set of 3D structures.

16. The method according to claim 14, wherein the formation of the colour converter module is carried out after removing the first set of 3D structures.

17. The method according to claim 16, wherein the contact area is protected by a protective layer during the formation of the colour converter module and further comprising:

before forming the access trench, forming a contact area under the bases of the first set of 3D structures, said contact area being intended to contact a driving electronics of the device.

* * * * *